(12) United States Patent
Ishikawa et al.

(10) Patent No.: US 6,677,781 B2
(45) Date of Patent: Jan. 13, 2004

(54) SEMICONDUCTOR INTEGRATED CIRCUIT DEVICE

(75) Inventors: Yasuyuki Ishikawa, Kariya (JP); Kouji Ichikawa, Kariya (JP); Hideaki Ishihara, Okazaki (JP)

(73) Assignee: Denso Corporation, Kariya (JP)

( * ) Notice: Subject to any disclaimer, the term of this patent is extended or adjusted under 35 U.S.C. 154(b) by 22 days.

(21) Appl. No.: 10/170,369

(22) Filed: Jun. 14, 2002

(65) Prior Publication Data

US 2002/0190578 A1 Dec. 19, 2002

(30) Foreign Application Priority Data

Jun. 15, 2001 (JP) .......................... 2001-181668

(51) Int. Cl.[7] .............................................. H01L 25/00
(52) U.S. Cl. ........................ 326/82; 326/101; 327/530
(58) Field of Search ................................ 326/33, 47, 80, 326/81, 82, 101, 102, 103; 327/333, 530

(56) References Cited

U.S. PATENT DOCUMENTS

| | | |
|---|---|---|
| 5,717,359 A | 2/1998 | Matsui et al. |
| 6,054,751 A | 4/2000 | Ichikawa et al. |
| 6,501,301 B2 * | 12/2002 | Taguchi .................. 326/101 |
| 2002/0011606 A1 | 1/2002 | Otake et al. |
| 2002/0014915 A1 | 2/2002 | Ishikawa et al. |

FOREIGN PATENT DOCUMENTS

| | | |
|---|---|---|
| EP | 1098555 A2 | 5/2001 |
| JP | 2-216862 | 8/1990 |
| JP | 2-250371 | 10/1990 |
| JP | 5-198742 | 8/1993 |
| JP | 7-106521 | 4/1995 |
| JP | 8-102525 | 4/1996 |
| JP | 8-288462 | 11/1996 |
| JP | 9-205357 | 8/1997 |
| JP | 10-150148 | 6/1998 |
| JP | 10-326868 | 12/1998 |
| JP | 11-177025 | 7/1999 |
| JP | 2001-135898 | 5/2001 |
| JP | 2002-9244 | 1/2002 |
| JP | 2002-43525 | 2/2002 |

* cited by examiner

*Primary Examiner*—Daniel Chang
(74) *Attorney, Agent, or Firm*—Posz & Bethards, PLC (57) ABSTRACT

A common power source line has first power supply points and second power supply points. The first power supply points are provided for supplying electric power to buffer circuits of low-frequency signal pads, while the second power supply points are provided for buffer circuits of high-frequency signal pads. A wiring distance from a power source pad to the second power supply points as well as a wiring distance from the first power supply points to the second power supply points are set to be relatively long in an overall wiring arrangement on a chip.

10 Claims, 5 Drawing Sheets

SEMICONDUCTOR INTEGRATED CIRCUIT DEVICE

BACKGROUND OF THE INVENTION

The present invention relates to a semiconductor integrated circuit device which includes a plurality of buffer circuits of signal pads operable in response to electric power supplied from a common power source line.

A packaged semiconductor integrated circuit device includes numerous terminals. Numerous bonding pads (each being referred to as 'pad' hereinafter) corresponding to respective terminals are formed on a chip.

Figure 5:
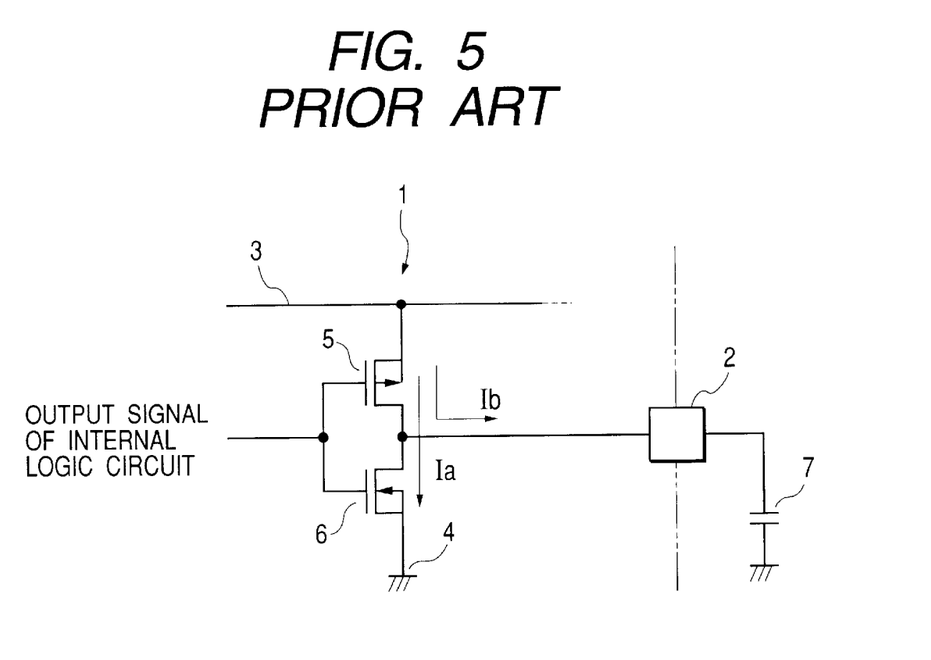
FIG. 5 is a circuit diagram showing a detailed arrangement of a buffer circuit of a conventional semiconductor integrated circuit device.

FIG. 5 shows a buffer circuit 1 formed on the chip and interposed between a signal output pad 2 and an internal logic circuit constituted by logic circuits or the like. The buffer circuit 1 inverts an output signal of the internal logic circuit and outputs an inverted signal to the pad 2. The buffer circuit 1 includes two MOS transistors 5 and 6 connected in series between power source lines 3 and 4.

In the buffer circuit 1 shown in FIG. 5, the output signal of the internal logic circuit for example turns into L level from H level. In this moment, a feedthrough current Ia flows across the MOS transistors 5 and 6 from the positive power source line 3 to the negative power source line 4. At the same time, a charge current Ib flows from the positive power source line 3 to an external circuit 7 via MOS transistor 5 and the pad 2. Both the feedthrough current Ia and the charge current Ib flow through the positive power source line 3. The positive power source line 3 has a resistance component. Hence, a significant voltage drop is caused in accordance with the currents Ia and Ib flowing through the positive power source line 3. Such momentary voltage drop will develop into fluctuation in the voltage level of positive power source line 3. Similar fluctuation will appear in the other power source line 4 because the negative power source line 4 has a resistance component, too.

The above-described voltage fluctuation (i.e., noise) caused in response to the switching of MOS transistors 5 and 6 becomes large with increasing frequency of an output signal of the internal logic circuit (i.e., the frequency of switching operations). The noise is transmitted to a power source pad (not shown) via the power source lines 3 and 4. Then, the noise leaks out of the semiconductor integrated circuit device via a power source terminal connected to the power source pad. Furthermore, the noise is transmitted to other signal pad via other buffer circuit which is operable in response to electric power supplied from the power source line 3. In this case, the noise leaks out of the semiconductor integrated circuit device via a signal terminal connected to this signal pad.

To reduce leakage of noises from the semiconductor integrated circuit, unexamined Japanese patent publication No. 11-177025 discloses a power supply line of internal logic circuits which is arranged in a zigzag pattern. According to this arrangement, the noise caused by the feedthrough current Ia is absorbed partly by a capacitance component of an internal logic circuit disposed at an intermediate portion of the zigzag power supply line and is suppressed by an inductance component of zigzag power supply line.

However, adopting the zigzag wiring pattern for the power supply line of internal logic circuits is disadvantageous in that the overall wiring distance increases excessively and accordingly a large voltage drop occurs in the long path of the power supply line. Namely, a voltage actually applied to each internal logic circuit is fairly smaller than the power source voltage applied to the power source pad. In other words, the internal logic circuit has a so small power voltage margin that the internal logic circuit may not operate properly when the voltage level of a power source fluctuates.

SUMMARY OF THE INVENTION

In view of the above-described problems, the present invention has an object to provide a semiconductor integrated circuit device which is capable of maintaining the power voltage margin of an internal logic circuit to an adequate level and is also capable of preventing the noises from leaking out of the semiconductor integrated circuit device when the noises are produced from buffer circuits of high-frequency signal pads provided for inputting and outputting signals having higher frequency components.

In order to accomplish the above and other related objects, the present invention provides a semiconductor integrated circuit device comprising at least one power source pad provided on a chip, a plurality of signal pads provided on the chip, at least one common power source line extending from the power source pad on the chip, buffer circuits provided for the signal pads, and power supply points of the common power source line for supplying electric power to the buffer circuits. The semiconductor integrated circuit device of the present invention is characterized in that the power supply points of the common power source line are classified into first power supply points for the buffer circuits of low-frequency signal pads and second power supply points for the buffer circuits of high-frequency signal pads. The low-frequency signal pads are used for inputting and outputting signals having relatively low frequency components, while the high-frequency signal pads are used for inputting and outputting signals having relatively high frequency components. And, a wiring distance from the power source pad to the second power supply points as well as a wiring distance from the first power supply points to the second power supply points are set to be relatively long in an overall wiring arrangement on the chip.

According to this arrangement, large noises generated in respective buffer circuits of the high-frequency signal pads greatly attenuate when the noises propagate via the long path of the common power source line to the low-frequency signal pads and to the power source pad. Hence, it becomes possible to prevent the noises from leaking out of the semiconductor integrated circuit device via respective low-frequency signal pads and also via the power source pad.

It is preferable that a group of the first power supply points and a group of the second power supply points are successively arranged on the common power source line extending from the power source pad. And, a wiring distance from the group of the first power supply points to the group of the second power supply points is longer than a wiring distance from the power source pad to the group of the first power supply points. The noises generated from the buffer circuits of the high-frequency signal pads surely attenuate during the propagation through the long path of the common power source line before they arrive at the low-frequency signal pads or to the power source pad.

Furthermore, it is preferable that a wiring distance from the power source pad to the first and second power supply points is determined considering high-frequency cutoff property of the common power source line which is dependent on a resistance component and a capacitance component of the common power source line. According to this arrangement, there is no necessity of extending respective power source lines so excessively. The chip size will not increase so much.

Furthermore, it is preferable that the resistance component and the capacitance component of the common power source line are taken into consideration at each wiring section between two adjacent first power supply points, each wiring section between two adjacent second power supply points, and a wiring section between the first power supply points and the second power supply points.

Furthermore, it is preferable that a capacitor is interposed between a positive common power source line and a negative common power source line. This is effective to suppress the noise having steep voltage changes caused by feedthrough current or charge/discharge current. As a result, the mutual distance between the power source pad and the power source supply points can be reduced. The chip size can be downsized.

For example, the low-frequency signal pads are used for inputting and outputting low-frequency signals including I/O (i.e., input/output) port signals of an internal logic circuit constituted by logic circuits.

For example, the high-frequency signal pads are used for inputting and outputting high-frequency signals including address bus signals, extended bus signals, and communication data signals.

Furthermore, it is preferable that the semiconductor integrated circuit device of the present invention further comprises an internal circuit provided on the chip, and a power source line provided on the chip for supplying electric power to the internal circuit. The power source line for the internal circuit is determined considering high-frequency cutoff property which is dependent on a resistance component and a capacitance component of the power source line for the internal circuit.

Alternatively, it is preferable that the power source line for supplying electric power to the internal circuit is isolated from the common power source line extending from the power source pad for supplying electric power to the buffer circuits.

Furthermore, it is preferable that the common power source line has a plurality of third power supply points for supplying electric power to the internal circuit. A wiring distance from the power source pad to each of the third power supply points as well as a wiring distance from each of the third power supply points to the first or second power supply points are set to be relatively long in an overall wiring arrangement on the chip. And, the third power supply points are separately provided on at least two common power source line portions extending along different edges of the chip.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Preferred embodiments of the present invention will be explained hereinafter with reference to attached drawings. Identical parts are denoted by the same reference numerals throughout the drawings.

First Embodiment

Figure 1:
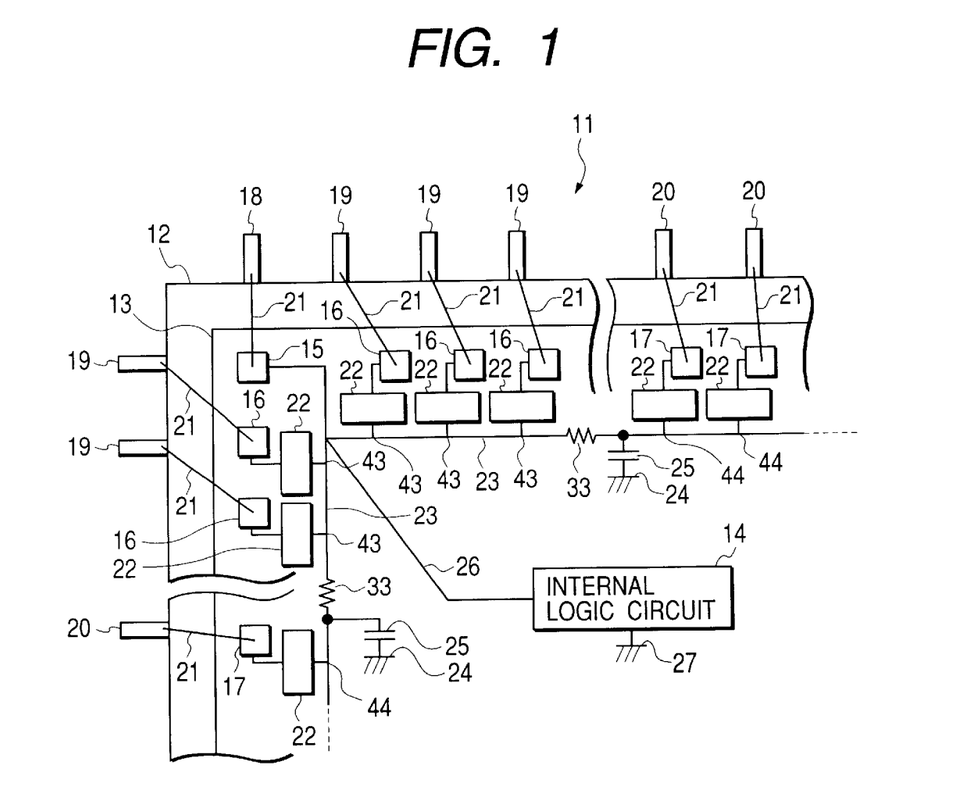
FIG. 1 is a circuit diagram showing a schematic arrangement of a semiconductor integrated circuit device in accordance with a first embodiment of the present invention.
Figure 2:
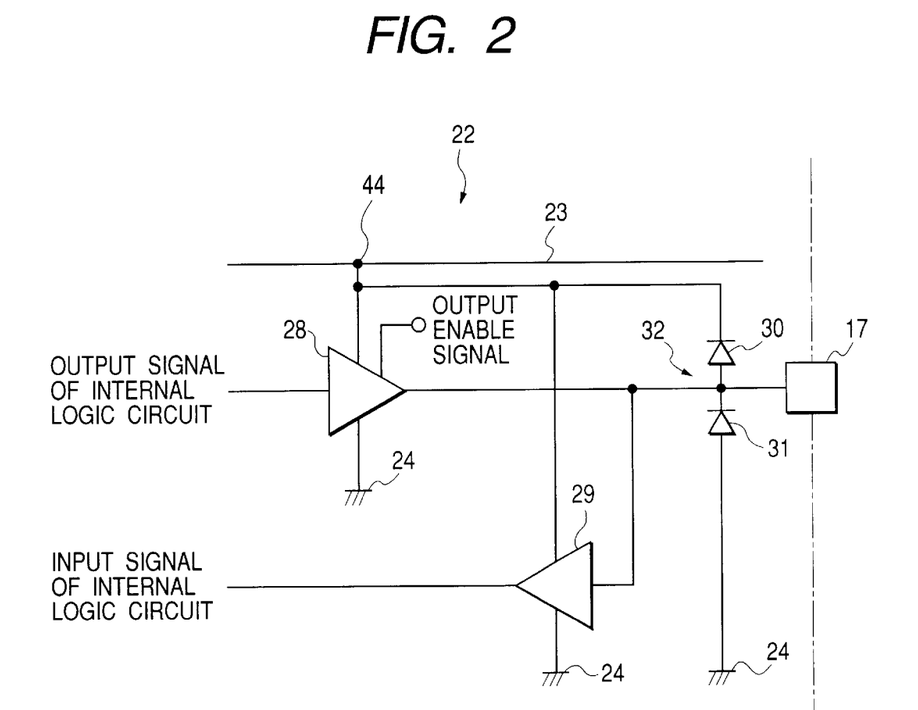
FIG. 2 is a circuit diagram showing a detailed arrangement of a buffer circuit of the semiconductor integrated circuit device in accordance with the first embodiment of the present invention.

FIGS. 1 and 2 show a semiconductor integrated circuit device in accordance with a first embodiment of the present invention.

In FIG. 1, a semiconductor integrated circuit device 11 has a package 12. A chip 13 is mounted on a lead frame located inside the package 12. The chip 13 is provided with an internal logic circuit 14 comprising a CPU, memories, and logic circuits. Numerous bonding pads are aligned along peripheral edges of an upper surface of chip 13.

More specifically, a positive power source pad 15 is formed at each corner of the upper surface of chip 13. The positive power source pad 15, connected to a power source (not shown), supplies electric power. A plurality of low-frequency signal pads 16 are located adjacent to the positive power source pad 15. The low-frequency signal pads 16 are arrayed in line at equal intervals. The low-frequency signal pads 16 are a group of pads operable in a relatively low frequency region. For example, the low-frequency signal pads 16 are used to input and output I/O port signals of the internal logic circuit 14.

On the other hand, a plurality of high-frequency signal pads 17 are located far from the positive power source pad 15 and also far from the low-frequency signal pads 16. The high-frequency signal pads 17 are arrayed in line at equal intervals. The high-frequency signal pads 17 are a group of pads operable in a relatively high frequency region. For example, the high-frequency signal pads 17 are used to input and output address bus signals, extended bus signals, and communication data signals of the internal logic circuit 14.

In this case, the clearance between the group of low-frequency signal pads 16 and the group of high-frequency signal pads 17 is set to be larger than the clearance between the positive power source pad 15 and the group of low-frequency signal pads 16. Furthermore, the clearance between the group of low-frequency signal pads 16 and the group of high-frequency signal pads 17 is set to be larger than the intervals of respective low-frequency signal pads 16 and also to be larger than the intervals of respective high-frequency signal pads 17. As a result, the distance from the positive power source pad 15 to each high-frequency signal pad 17 is long. The distance from each low-frequency signal pad 16 to each high-frequency signal pad 17 is long, too.

The package 12 is provided with a power source terminal 18, low-frequency signal terminals 19, and high-frequency signal terminals 20 which are connected via bonding wires 21 to the above-described power source pad 15, low-frequency signal pads 16, and high-frequency signal pads 17, respectively. According to this embodiment, a clearance between the power source terminal 18 and the closest low-frequency signal terminal 19 is equal to the intervals of low-frequency signal terminals 19. The intervals of low-frequency signal terminals 19 are equal to the intervals of high-frequency signal terminals 20. The clearance between the low-frequency signal terminals 19 and the high-frequency signal terminals 20 is large compared with the intervals of low-frequency signal terminals 19 or high-frequency signal terminals 20.

On the chip 13, a buffer circuit 22 is formed closely to each signal pad 16 or 17. A positive power source line 23 extends from the positive power source pad 15 along each edge of chip 13. Similarly, a negative power source line 24 extends from a negative power source pad (not shown) along each edge of chip 13. Each buffer circuit 22 is interposed between these common power source lines 23 and 24 to receive electric power. The positive power source line 23 has a plurality of first power supply points 43 and a plurality of second power supply points 44 positioned closely to respective buffer circuits 22.

The first and second power supply points 43 and 44 are aligned at equal intervals so as to correspond to the signal pads 16 and 17, respectively. The intervals of first power supply points 43 are identical with the intervals of low-frequency signal pads 16 disposed on the chip 13. The intervals of second power supply points 44 are identical with the intervals of high-frequency signal pads 17 disposed on the chip 13. The first power supply points 43 are connected to the buffer circuits 22 of low-frequency signal pads 16. The second power supply points 44 are connected to the buffer circuits 22 of high-frequency signal pads 17. A wiring distance from a group of first power supply points 43 to a group of second power supply points 44 is longer than a wiring distance from the positive power source pad 15 to the group of first power supply points 43. As a result, the wiring distance from the positive power source pad 15 to each second power supply point 44 is long. And, the wiring distance from each first power supply point 43 to the second power supply point 44 is long, too. Although not shown in the drawing, the negative power source line 24 has similar power supply points.

A capacitor 25 is provided between the positive power source line 23 and the negative power source line 24. In FIG. 1, the positive power source line 23 is depicted by a solid line while the negative power source line 24 is symbolized by a ground mark. A positive power source line 26 extends from the positive power source pad 15 to the internal logic circuit 14. A negative power source line 27 extends from the negative power source pad (not shown) to the internal logic circuit 14. The power source line of positive power source pad 15 is branched or bifurcated into the positive power source line 23 and the positive power source line 26.

FIG. 2 shows a detailed arrangement of the buffer circuit 22 provided for each high-frequency signal pad 17. The buffer circuit 22 shown in FIG. 2 comprises an output buffer circuit 28, an input buffer circuit 29, and an excessive voltage protecting circuit 32. The output buffer circuit 28 receives a signal produced from the internal logic circuit 14 and outputs this signal to the high-frequency signal pad 17. The input buffer circuit 29 receives a signal entered from the high-frequency signal terminal 20 to the high-frequency signal pad 17 and outputs this signal to the internal logic circuit 14. The excessive voltage protecting circuit 32 consists of two diodes 30 and 31. The diode 30 has an anode connected to the positive power source line 23 and a cathode connected to the high-frequency signal pad 17. The diode 31 has an anode connected to the high-frequency signal pad 17 and a cathode connected to the negative power source line 24.

The output buffer circuit 28 comprises a MOS transistor interposed between the positive power source line 23 and the high-frequency signal pad 17 and another MOS transistor interposed between the high-frequency signal pad 17 and the negative power source line 24 (refer to FIG. 5). The input buffer circuit 29 has a circuit arrangement similar to that of the output buffer circuit 28. The MOS transistor sizes of the output buffer circuit 28 are several tens times as large as those of the input buffer circuit 29. The output buffer circuit 28 has an enable function for letting its output section have a high impedance.

The semiconductor integrated circuit device 11 produces switching noises in the following manner.

As explained with reference to FIG. 5, in response to on-and-off switching operations of the MOS transistors constituting the output buffer circuit 28, the feedthrough current Ia flows from the positive power source line 23 to the negative power source line 24. The charge/discharge current Ib flows from the positive power source line 23 to the high-frequency signal pad 17 or from the high-frequency signal pad 17 to the negative power source line 24. The transistor area of output buffer circuit 28 is larger than that of input buffer circuit 29. The capacitance component of an external circuit of semiconductor integrated circuit device 11 is larger than that of the internal logic circuit 14. Hence, the feedthrough current Ia and the charge/discharge current Ib flowing across the output buffer circuit 28 are larger than those flowing across the input buffer circuit 29. A steep voltage change occurs at respective second power supply points 44 on the positive power source line 23. Similarly, a steep voltage change occurs at respective power supply points on the negative power source line 24.

The steep voltage change, i.e., switching noise, becomes large with increasing frequency of an output signal of the internal logic circuit 14. Accordingly, the switching noise generated from the buffer circuit 22 of high-frequency signal pad 17 is larger than the switching noise generated from the buffer circuit 22 of low-frequency signal pad 16.

The switching noise generated from the buffer circuit 22 of high-frequency signal pad 17 propagates from a corresponding power source supply point 44 to the positive power source line 23. Similar propagation of switching noise occurs in the negative power source line 24. Each of the positive power source line 23 and the negative power source line 24 possesses a resistance component 33 (refer to FIG. 1) as well as a capacitance component which are uniformly distributed along each wiring. Furthermore, the capacitor 25 is provided between the positive power source line 23 and the negative power source line 24. The resistance component and the capacitance component (including capacitor 25) cooperatively constitute a lowpass filter for attenuating high-frequency noises.

According to this embodiment, the positive power source pad 15, a group of low-frequency signal pads 16, and a group of high-frequency signal pad 17 are successively aligned in this order. The first power supply points 43 for the buffer circuits 22 of low-frequency signal pads 16 and the second power supply points 44 for the buffer circuits 22 of high-frequency signal pads 17 are provided on the positive power source line 23. The wiring distance from the first power supply points 43 to the second power supply points 44 is long. Thus, the switching noise greatly attenuates when it propagates the long path of power source line 23 (or 24) ranging from the high-frequency signal pads 17 to the low-frequency signal pads 16. Accordingly, the switching noise becomes very small when it arrives at respective buffer circuits 22 of the low-frequency signal pads 16. Hence, the switching noises leaking out of the semiconductor integrated circuit device 11 via respective low-frequency signal pads 16 and signal terminals 19 are greatly reduced.

Furthermore, the positive power source pad 15 is located far from the high-frequency signal pads 17. This provides excellent high-frequency component cutoff property. The switching noise generated from the buffer circuits 22 of high-frequency signal pads 17 becomes very small when it arrives at the positive power source pad 15 after having propagated the long path of power source line 23 (or 24). Hence, the switching noise leaking out of the semiconductor integrated circuit device 11 via the positive power source pad 15 and the power source terminal 18 is greatly reduced.

In this case, the wiring distance from the group of first power supply points 43 to the group of second power supply points 44 as well as the capacitance of capacitor 25 are determined considering the high-frequency cutoff property of the wiring pattern of chip 13. The high-frequency cutoff property is dependent on a resistance component and a capacitance component of respective power source lines 23 and 24. The resistance component and the capacitance component of respective power source lines 23 and 24 are taken into consideration at each wiring section between two adjacent first power supply points 43, each wiring section between two adjacent second power supply points 44, and a wiring section between the first power supply points 43 and the second power supply points 44. In practice, there is no necessity of extending respective power source lines 23 and 24 so excessively. The chip size does not increase so much.

Furthermore, the current consumption in respective buffer circuits 22 is sufficiently small compared with that in the internal logic circuit 14. Accordingly, even if the wiring distance from the positive power source pad 15 to the second power supply points 44 is long, the voltage drop caused by the resistance component of the power source lines 23 and 24 is a smaller value. The power voltage margin of each buffer circuit 22 can be maintained at a satisfactory level. Furthermore, the internal logic circuit 14 receives electric power from the power source lines 26 and 27 which are disposed to provide the short paths extending from respective power source pads to the internal logic circuit 14. The internal logic circuit 14 can directly receive the electric power from the power source pads through relatively short paths. The voltage drop caused in the source lines 26 and 27 can be minimized. The power voltage margin of the internal logic circuit 14 can be maintained at an allowable level.

Second Embodiment

Figure 3:
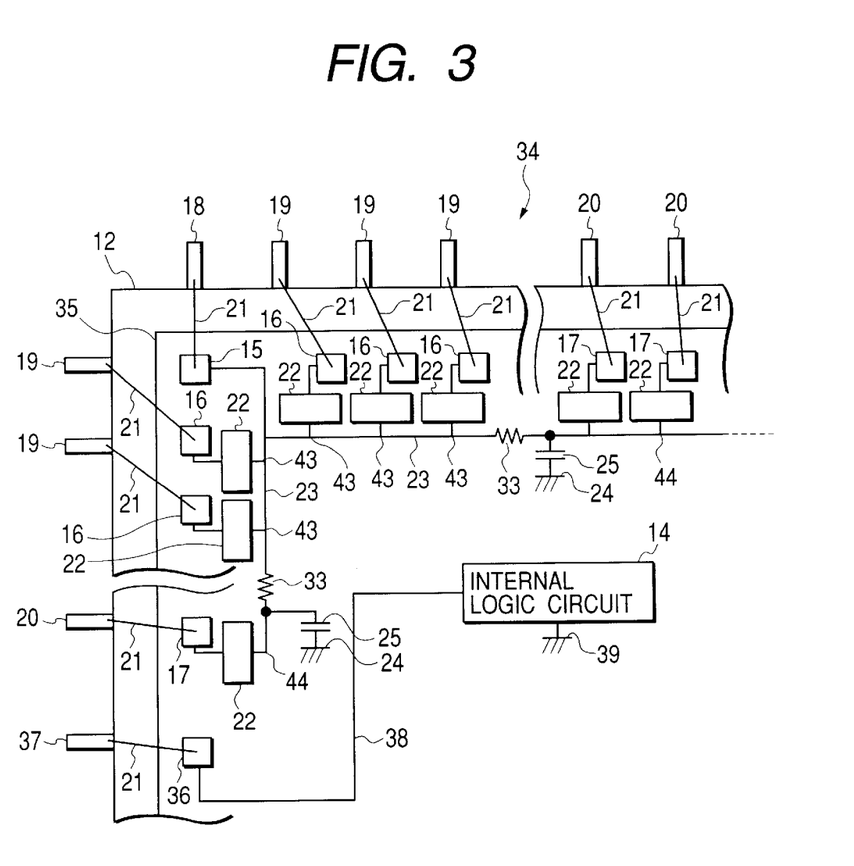
FIG. 3 is a circuit diagram showing a schematic arrangement of a semiconductor integrated circuit device in accordance with a second embodiment of the present invention.

FIG. 3 shows a semiconductor integrated circuit device in accordance with a second embodiment of the present invention.

A semiconductor integrated circuit device 34 shown in FIG. 3 differs from the semiconductor integrated circuit device 11 shown in FIG. 1 in that an additional positive power source pad 36 is formed on a chip 35. The positive power source pad 36 is connected to the internal logic circuit 14 via an additional positive power source line 38. The positive power source line 38 is independent from the positive power source line 23 of the buffer circuits 22. The positive power source pad 36 is connected to a positive power source terminal 37 formed on the package 12. A negative power source pad (not shown) is connected to the internal logic circuit 14 via an additional negative power source line 39. The rest of the circuit arrangement of the second embodiment is identical with the corresponding portions of the above-described first embodiment.

The current consumption in the internal logic circuit 14 is large. The operation of internal logic circuit 14 tends to cause a fluctuation of power source voltage. According to this embodiment, the power source lines 38 and 39 are isolated from the power source lines 23 and 24 of the buffer circuits 22. This makes it possible to prevent the noises from leaking out of the semiconductor integrated circuit device 34 via the power source terminal 18 or via respective signal terminals 19 and 20 when the noises are caused from the internal logic circuit 14. Adding an external capacitor to the positive power source terminal 37 or to a negative power source terminal (not shown) or applying another means for eliminating the noise is effective to easily suppress the noises generated from the internal logic circuit 14. The noises generated from the internal logic circuit 14 can be surely prevented from leaking out of the semiconductor integrated circuit device 34.

Third Embodiment

Figure 4:
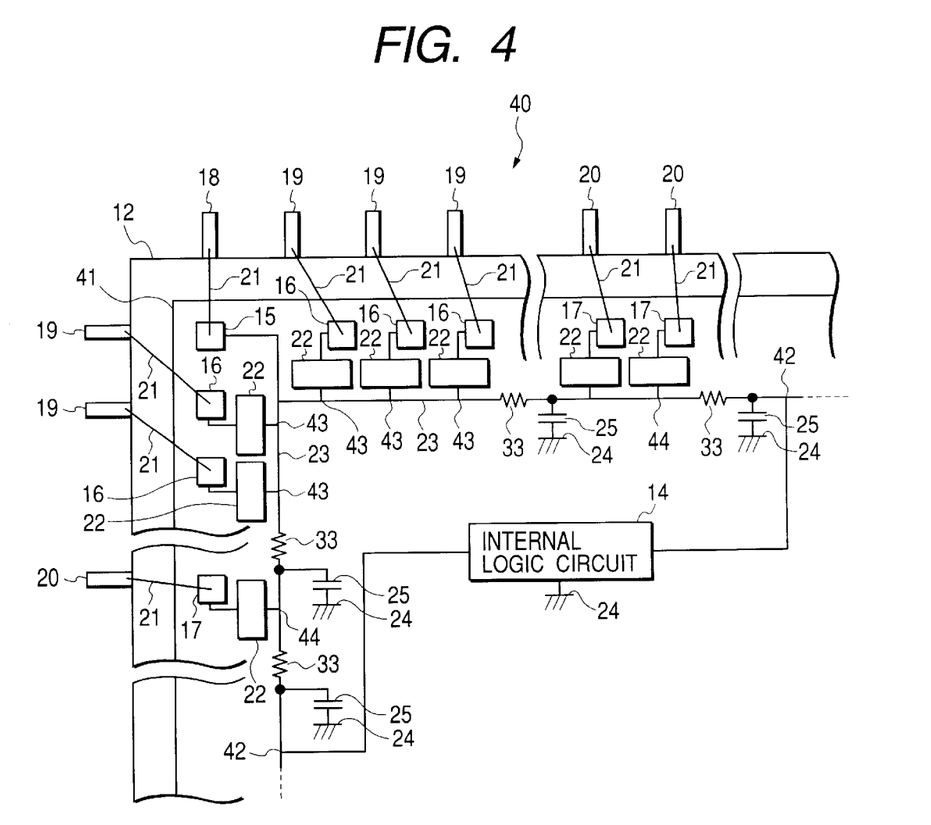
FIG. 4 is a circuit diagram showing a schematic arrangement of a semiconductor integrated circuit device in accordance with a third embodiment of the present invention.

FIG. 4 shows a semiconductor integrated circuit device in accordance with a third embodiment of the present invention.

A semiconductor integrated circuit device 40 shown in FIG. 4 differs from the semiconductor integrated circuit 11 shown in FIG. 1 in that the internal logic circuit 14 is connected to the power source line 23 at a plurality of power supply points far from the positive power source pad 15 than the first power supply points 43 and the second power supply points 44. The rest of the circuit arrangement of the third embodiment is identical with the corresponding portions of the above-described first embodiment.

More specifically, a power supply point 42 to the internal logic circuit 14 is provided on the power source line 23. The power supply point 42 is located at the downstream side of the group of second power supply points 44 with respect to the positive power source pad 15 located at the upstream end of the positive power source line 23. The wiring distance from the power supply point 42 to the group of second power supply points 44 is substantially equal to or longer than the wiring distance from the group of first power supply points 43 to the group of second power supply points 44.

The positive power source line 23 extends from the positive power source pad 15 along each edge of chip 41. A plurality of power supply point 42 are provided separately and far from each other on at least two portions on power source line 23 extending along the edges of the chip 41. Similar wiring arrangement (i.e., power supply points for the internal logic circuit 14) is provided for the negative power source line 24.

According to this arrangement, the noise caused from the internal logic circuit 14 propagates via the power source lines 23 and 24 to the power source side. Due to high-frequency cutoff property of the power source lines 23 and 24, the noise caused from the internal logic circuit 14 greatly attenuates when it propagates the long path of power source line 23 (or 24). The high-frequency cutoff property of each power source line is dependent on the resistance component and the capacitance component (including the capacitor 25) of the power source lines 23 and 24.

According to the third embodiment of the present invention, the clearance between the power supply point 42 and the second power supply points 44 is set relatively large. This arrangement enhances the high-frequency cutoff property of the wiring path extending from the power supply point 42 to the second power supply points 44. The noise generated from the internal logic circuit 14 greatly attenuates when it propagates the long path of power source line 23 (or 24) ranging from the power supply point 42 to the high-frequency signal pads 17. The noise becomes very small when it arrives at respective buffer circuits 22 of the high-frequency signal pads 17. Furthermore, the noise greatly attenuates when it propagates the long path of power source line 23 (or 24) ranging from the high-frequency signal pads 17 to the low-frequency signal pads 16. Accordingly, the noise becomes very small when it arrives at respective buffer circuits 22 of the low-frequency signal pads 16. Hence, the noises leaking out of the semiconductor integrated circuit device 40 via respective terminals 18, 19 and 20 can be reduced effectively.

As a plurality of power supply points 42 are separately located far from each other on the positive power source line 23, the internal logic circuit 14 receives electric power from different routes of wiring paths. As a result, it becomes possible to suppress the voltage drop in respective power source lines 23 and 24. It hence becomes possible to secure a sufficient power voltage margin of the internal logic circuit 14.

The present invention is not limited to the above-described embodiments and therefore can be modified in various ways.

For example, in the above-described first or second embodiment, it is possible to add appropriate resistors to the power source lines 23 and 24 while the power voltage margin of the buffer circuits 22 is sufficiently secured. This modification will enhance the high-frequency cutoff property against the switching noises. Similarly, in the above-described third embodiment, it is possible to add appropriate resistors to the power source lines 23 and 24 while the power voltage margins of the internal logic circuit 14 and the buffer circuits 22 are sufficiently secured.

In each of the above-described embodiments, the power source pad 15 is provided at each corner of the chip. This arrangement is advantageous in that, when the semiconductor integrated circuit device is mounted on a substrate, a capacitor or any other noise reducing component can be easily installed on the substrate. However, the location of power source pad 15 is not limited to the corner of the chip.

What is claimed is:

1. A semiconductor integrated circuit device comprising:
   at least one power source pad provided on a chip;
   a plurality of signal pads provided on said chip;
   at least one common power source line extending from said power source pad on said chip;
   buffer circuits provided for said signal pads; and
   power supply points of said common power source line for supplying electric power to said buffer circuits,
   wherein said power supply points are classified into first power supply points for the buffer circuits of low-frequency signal pads and second power supply points for the buffer circuits of high-frequency signal pads, said low-frequency signal pads being used for inputting and outputting signals having relatively low frequency components while said high-frequency signal pads being used for inputting and outputting signals having relatively high frequency components, and
   a wiring distance from said power source pad to said second power supply points as well as a wiring distance from said first power supply points to said second power supply points are set to be relatively long in an overall wiring arrangement on said chip.

2. The semiconductor integrated circuit device in accordance with claim 1, wherein
   a group of said first power supply points and a group of said second power supply points are successively arranged on said common power source line extending from said power source pad, and
   a wiring distance from the group of said first power supply points to the group of said second power supply points is longer than a wiring distance from said power source pad to the group of said first power supply points.

3. The semiconductor integrated circuit device in accordance with claim 1, wherein a wiring distance from said power source pad to said first and second power supply points is determined considering high-frequency cutoff property of said common power source line which is dependent on a resistance component and a capacitance component of said common power source line.

4. The semiconductor integrated circuit device in accordance with claim 3, wherein the resistance component and the capacitance component of said common power source line are taken into consideration at each wiring section between two adjacent first power supply points, each wiring section between two adjacent second power supply points, and a wiring section between said first power supply points and said second power supply points.

5. The semiconductor integrated circuit device in accordance with claim 1, wherein a capacitor is interposed between a positive common power source line and a negative common power source line.

6. The semiconductor integrated circuit device in accordance with claim 1, wherein said low-frequency signal pads are used for inputting and outputting low-frequency signals including I/O port signals of an internal logic circuit constituted by logic circuits.

7. The semiconductor integrated circuit device in accordance with claim 1, wherein said high-frequency signal pads are used for inputting and outputting high-frequency signals including address bus signals, extended bus signals, and communication data signals.

8. The semiconductor integrated circuit device in accordance with claim 1, further comprising
   an internal circuit provided on said chip, and
   a power source line provided on said chip for supplying electric power to said internal circuit,
   wherein said power source line for said internal circuit is determined considering high-frequency cutoff property which is dependent on a resistance component and a capacitance component of said power source line for said internal circuit.

9. The semiconductor integrated circuit device in accordance with claim 1, further comprising
   an internal circuit provided on said chip, and
   a power source line provided on said chip for supplying electric power to said internal circuit,
   wherein said power source line for supplying electric power to said internal circuit is isolated from said common power source line extending from said power source pad for supplying electric power to said buffer circuits.

10. The semiconductor integrated circuit device in accordance with claim 1, further comprising
    an internal circuit provided on said chip, and
    said common power source line has a plurality of third power supply points for supplying electric power to said internal circuit,
    wherein a wiring distance from said power source pad to each of said third power supply points as well as a wiring distance from each of said third power supply points to said first or second power supply points are set to be relatively long in an overall wiring arrangement on said chip, and
    said third power supply points are separately provided on at least two common power source line portions extending along different edges of said chip.

* * * * *